United States Patent
Piech et al.

(10) Patent No.: US 8,325,332 B2
(45) Date of Patent: Dec. 4, 2012

(54) START-UP METHODS FOR FREQUENCY CONVERTED LIGHT SOURCES

(75) Inventors: Garrett Andrew Piech, Corning, NY (US); Dragan Pikula, Horseheads, NY (US); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 247 days.

(21) Appl. No.: 12/908,117

(22) Filed: Oct. 20, 2010

(65) Prior Publication Data
US 2012/0026488 A1    Feb. 2, 2012

Related U.S. Application Data (60) Provisional application No. 61/369,346, filed on Jul. 30, 2010.

(51) Int. Cl.
*G01B 11/26* (2006.01)
(52) U.S. Cl. .................................. 356/139.05
(58) Field of Classification Search ........ 356/3.01–3.15, 356/4.01–4.1, 5.01–5.15, 6–22, 28, 28.5, 356/139.01–139.1
See application file for complete search history.

(56) References Cited

U.S. PATENT DOCUMENTS

| | | | |
|---|---|---|---|
| 7,457,031 B1 | 11/2008 | Gollier | |
| 7,542,492 B2 | 6/2009 | Bhatia | |
| 7,729,397 B1 | 6/2010 | Gollier et al. | |
| 7,835,065 B2 | 11/2010 | Almoric et al. | |
| 2003/0185516 A1* | 10/2003 | Kennedy et al. | 385/49 |
| 2009/0022188 A1* | 1/2009 | Almoric et al. | 372/22 |
| 2009/0190131 A1* | 7/2009 | Gollier et al. | 356/400 |
| 2010/0150185 A1 | 6/2010 | Gollier et al. | 372/20 |
| 2010/0272134 A1 | 10/2010 | Blanding et al. | |
| 2011/0303820 A1 | 12/2011 | Gollier et al. | |

OTHER PUBLICATIONS

Risk, W.P. et al.; Compact blue-green lasers, Cambridge University Press, 2003. (entire book).
Feb. 22, 2012 PCT Search Report and Written Opinion prepared by European Patent Office as International Searching Authority for corresponding International application No. PCT/US2011/044768.

\* cited by examiner

*Primary Examiner* — Luke Ratcliffe
(74) *Attorney, Agent, or Firm* — Svetlana Z. Short (57) ABSTRACT

Start-up methods for frequency converted light sources and projector systems comprising frequency converted light sources are described herein. The start-up methods generally comprise modulating the frequency converted light source over three degrees of freedom (two spatial dimensions and one wavelength dimension). Specifically, fast oscillation of an axis of an adjustable optical component is performed simultaneously with fast oscillation of a wavelength of the semiconductor laser while a second axis of the adjustable optical component is incrementally stepped and the output intensity of the frequency converted light source is monitored for each step. This start-up method allows for three linear searches to be used to rapidly locate the appropriate control settings for the frequency converted light source.

20 Claims, 7 Drawing Sheets

START-UP METHODS FOR FREQUENCY CONVERTED LIGHT SOURCES

CROSS REFERENCE

The present disclosure claims priority to U.S. Provisional Application 61/369,346, filed Jul. 30, 2010 and entitled "Start-Up Methods for Frequency Converted Light Sources".

BACKGROUND

1. Field of the Invention

The present disclosure generally relates to semiconductor lasers, laser controllers, frequency converted light sources, and other optical systems incorporating semiconductor lasers. More specifically, the present invention relates to methods for aligning frequency converted light sources that include, inter alia, a semiconductor laser optically coupled to a second harmonic generation (SHG) crystal, or another type of wavelength conversion device, with adaptive optics.

2. Technical Background

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input facet of the wavelength converting crystal.

Waveguide optical mode field diameters of typical SHG crystals, such as MgO-doped periodically poled lithium niobate (PPLN) crystals, can be in the range of a few microns while semiconductor lasers used in conjunction with the wavelength conversion device may comprise single-mode waveguides having diameters of approximately the same dimensions. As a result, properly aligning the beam from the semiconductor laser with the waveguide of the SHG crystal such that the output of the SHG crystal is optimized may be a difficult task which requires that the position of the beam of the semiconductor laser be precisely controlled along two axes on the input face of the SHG crystal.

Similarly, the phase matching bandwidth of SHG crystals are typically narrow, generally less than 1 nm. For example, for a 12 mm long PPLN crystal, the phase matching bandwidth may be about 0.16 nm. As such, the wavelength of the semiconductor laser must be precisely controlled to properly align the semiconductor laser with the SHG crystal and obtain the desired output intensity and wavelength from the SHG crystal.

SUMMARY

In one embodiment shown and described herein, a start-up method for a frequency converted light source comprising a semiconductor laser, a wavelength conversion device, and an adjustable optical component arranged to optically couple an output beam of the semiconductor laser with an input facet of the wavelength conversion device is described. The start-up method includes directing the output beam of the semiconductor laser onto an input facet of the wavelength conversion device with the adjustable optical component. The wavelength of the output beam of the semiconductor laser is modulated over a wavelength alignment range corresponding to at least a portion of the phase-matching bandwidth of a waveguide portion of the wavelength conversion device as the output intensity of a wavelength converted output beam emitted from the wavelength conversion device is monitored. The adjustable optical component is oscillated over a first angular range about a first scanning axis such that the output beam of the semiconductor laser is dithered over the input facet of the wavelength conversion device on a first dithering trace. The angular orientation of the adjustable optical component is adjusted about a second scanning axis to vary a position of the first dithering trace over the input facet of the wavelength conversion device on a first scan line as the wavelength of the output beam is modulated and the adjustable optical component is oscillated about the first scanning axis. A first alignment set point on the first scan line is determined based on the output intensity of the wavelength converted output beam as the position of the first dithering trace is varied over the first scan line. Thereafter, the adjustable optical component is oscillated over a second angular range about a second scanning axis such that the output beam of the semiconductor laser is dithered over the input facet of the wavelength conversion device on a second dithering trace centered on the first alignment set point. The angular orientation of the adjustable optical component is adjusted about the first scanning axis to vary a position of the second dithering trace over the input facet of the wavelength conversion device on a second scan line as the wavelength of the output beam is modulated and the adjustable optical component is oscillated about the second scanning axis. A second alignment set point on the second scan line is determined based on the output intensity of the wavelength converted output beam as the position of the second dithering trace is varied over the second scan line, wherein the first alignment set point and the second alignment set point define a position where the output beam of the wavelength conversion device is aligned with the waveguide portion of the wavelength conversion device. The modulation of the wavelength of the output beam of the semiconductor laser is terminated an the output beam of the semiconductor laser on the waveguide portion of the wavelength conversion device using the first alignment set point and the second alignment set point.

According to another embodiment shown and described herein, a start-up method for a projection system comprising a first light source, a second light source and a frequency converted light source comprising a semiconductor laser, a wavelength conversion device, and an adjustable optical component arranged to optically couple a output beam of the semiconductor laser with an input facet of the wavelength conversion device is disclosed. The start-up method generally includes supplying the first light source with a first gain current $I_1$ at a first modulated gain frequency $F_{f1}$, supplying the second light source with a second gain current $I_2$ at a second modulated frequency $F_{f2}$ and supplying the frequency converted light source with a constant gain current $I_C$. A combined output intensity of the first light source, the second light source and the frequency converted light source is monitored at a frame rate $F_0$ of the projection system. The output beam of the semiconductor laser is directed onto an input facet of the wavelength conversion device with the adjustable optical component and a wavelength of the output beam of the semiconductor laser is modulated over a wavelength alignment range corresponding to at least a portion of the phase-matching bandwidth of a waveguide portion of the wavelength conversion device. The adjustable optical component is oscillated over a first angular range about a first scanning axis such that the output beam of the semiconductor laser is dithered over the input facet of the wavelength conversion device on a first dithering trace, wherein the adjustable optical component is oscillated about the first scanning axis at a first oscillation frequency $F_1=(N+\frac{1}{4})*F_0$, where $2 \leq N \leq 10$. The angular orientation of the adjustable optical component is adjusted about a second scanning axis to vary a position of the first dithering trace over the input facet of the wavelength conversion device on a first scan line. A first alignment set point on the first scan line is determined by filtering the combined output intensity to isolate a portion of the combined output intensity attributable to an output intensity of a wavelength converted output beam emitted from the wavelength conversion device as the position of the first dithering trace is varied over the first scan line. Thereafter, the adjustable optical component is oscillated over a second angular range about a second scanning axis such that the output beam of the semiconductor laser is dithered over the input facet of the wavelength conversion device on a second dithering trace centered on the first alignment set point, wherein the second angular range is less than the first angular range, and the adjustable optical component is oscillated about the second scanning axis at a second oscillation frequency $F_2=F_1$. The angular orientation of the adjustable optical component is adjusted about the first scanning axis to vary a position of the second dithering trace over the input facet of the wavelength conversion device on a second scan line. A second alignment set point on the second scan line is determined by filtering the combined output intensity to isolate a portion of the combined output intensity attributable to an output intensity of the wavelength converted output beam emitted from the wavelength conversion device as the position of the second dithering trace is varied over the second scan line, wherein the first alignment set point and the second alignment set point define a position where the output beam of the wavelength conversion device is aligned with the waveguide portion of the wavelength conversion device. The modulation of the wavelength of the output beam of the semiconductor laser and the output beam of the semiconductor laser is positioned on the waveguide portion of the wavelength conversion device using the first alignment set point and the second alignment set point.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION

Figure 1:
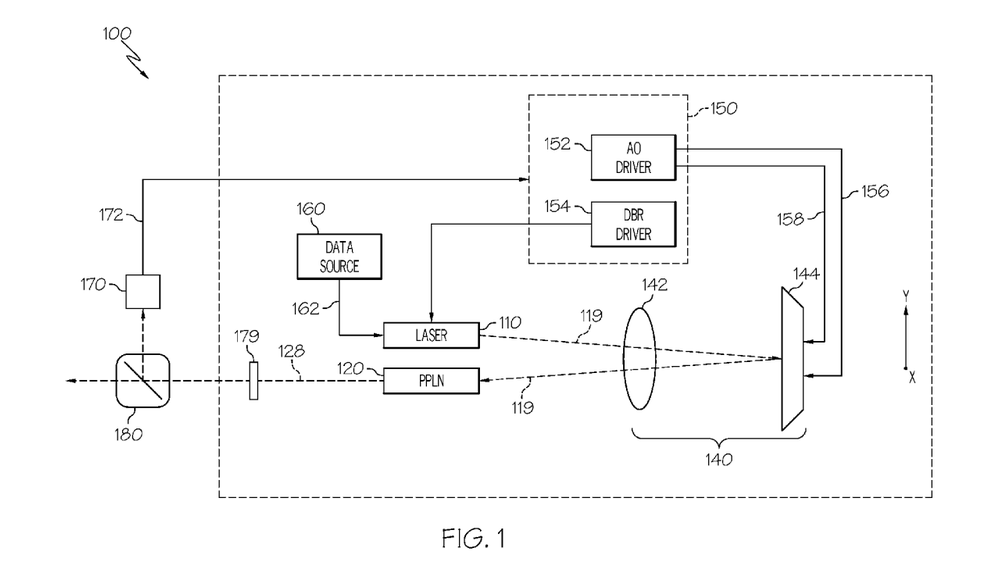
FIG. 1 schematically depicts one embodiment of an frequency converted light source shown and described herein.

Reference will now be made in detail to embodiments of start-up methods for frequency converted light sources, examples of which are illustrated in the accompanying drawings. Whenever possible, the same reference numerals will be used throughout the drawings to refer to the same or like parts. One embodiment of a frequency converted light source for use in conjunction with the control methods described herein is shown in FIG. 1. The frequency converted light source generally comprises a semiconductor laser, adaptive optics, a wavelength conversion device and a package controller. The output of the semiconductor laser is optically coupled into the input facet of the wavelength conversion device with the adaptive optics. The package controller is electrically coupled to the semiconductor laser and the adaptive optics and configured to control the output of the semiconductor laser and the alignment of the semiconductor laser with the wavelength conversion devices. Frequency converted light sources and start-up methods for aligning the components of the frequency converted light sources will be further described herein.

FIG. 1 generally depicts one embodiment of a frequency converted light source 100 described herein. It should be understood that the solid lines and arrows indicate the electrical interconnectivity of various components of the frequency converted light source. These solid lines and arrows are also indicative of electrical signals propagated between the various components including, without limitation, electronic control signals, data signals and the like. Further, it should also be understood that the dashed arrows indicate light beams, such as infrared and/or visible light beams, emitted by the semiconductor laser and the wavelength conversion device.

Referring initially to FIG. 1, the concepts of particular embodiments of the methods described herein may be conveniently illustrated with general reference to the frequency converted light source 100 which includes, for example, a semiconductor laser 110 optically coupled to a wavelength conversion device 120. An output beam 119 of the semiconductor laser 110 is coupled into the waveguide portion of wavelength conversion device 120 using adaptive optics 140. The wavelength conversion device 120 converts the output beam 119 (such as an infrared light beam) into higher harmonic waves and outputs a wavelength converted output beam 128. This type of frequency converted light source is particularly useful in generating shorter wavelength laser beams from longer wavelength semiconductor lasers and can be used, for example, as a visible laser source for laser projection systems.

Figure 2:
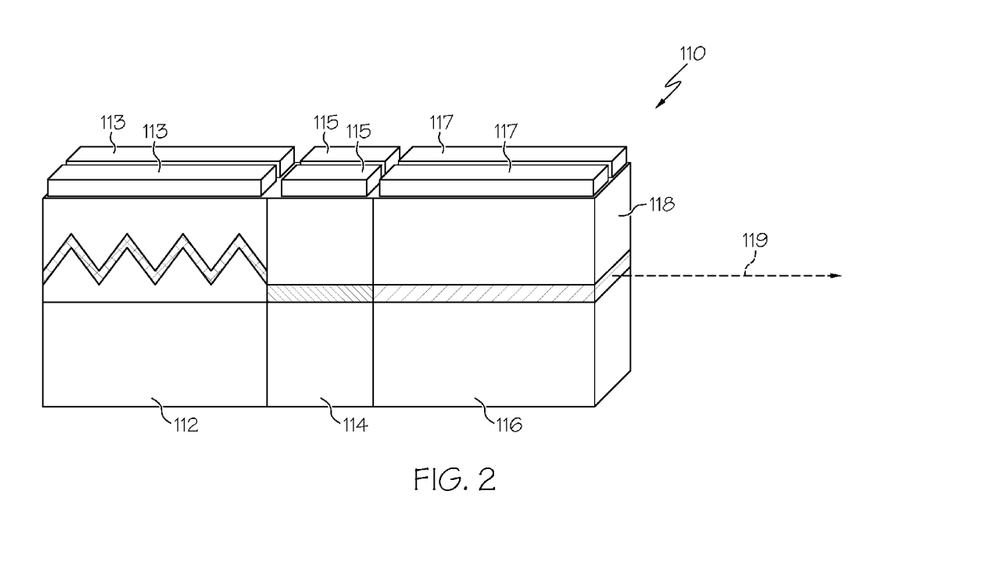
FIG. 2 schematically depicts a semiconductor laser for use in conjunction with one or more embodiments of the frequency converted light sources shown and described herein.

One embodiment of a semiconductor laser 110 is schematically illustrated in FIG. 2. The semiconductor laser generally comprises a wavelength selective section 112, a phase section 114, and a gain section 116. The wavelength selective section 112, which may also be referred to as the distributed Bragg reflector or DBR section of the semiconductor laser 110, typically comprises a first order or second order Bragg grating positioned outside the active region of the laser cavity. This section provides wavelength selection, as the grating acts as a mirror whose reflection coefficient depends on the wavelength. The gain section 116 of the semiconductor laser 110 provides the major optical gain of the laser and the phase section 114 creates an adjustable optical path length or phase shift between the gain material of the gain section 116 and the reflective material of the wavelength selective section 112. The wavelength selective section 112 may be provided in a number of suitable alternative configurations that may or may not employ a Bragg grating.

Respective control electrodes 113, 115, 117 are incorporated in the wavelength selective section 112, the phase section 114, the gain section 116, or combinations thereof, and are merely illustrated schematically in FIG. 2. It is contemplated that the electrodes 113, 115, 117 may take a variety of forms. For example, the control electrodes 113, 115, 117 are illustrated in FIG. 2 as respective electrode pairs but it is contemplated that single electrode elements in one or more of the sections 112, 114, 116 will also be suitable. The control electrodes 113, 115, 117 can be used to inject electrical current into the corresponding sections 112, 114, 116 of the semiconductor laser 110. For example, in one embodiment, current injected in to the wavelength selective section 112 of the semiconductor laser 110 can be used to control the wavelength $\lambda_1$ of the output beam 119 emitted from the output facet 118 of the semiconductor laser 110 by altering the operating properties of the laser. The injected current may be used to control the temperature of the wavelength selective section 112 or the index of refraction of the wavelength selective section. Accordingly, by adjusting the amount of current injected into the wavelength selective section, the wavelength of the output beam 119 emitted by the semiconductor laser may be varied. Current injected into the phase section 114 or gain section 116 may be similarly used to control the output of the semiconductor laser 110.

Figure 3A:
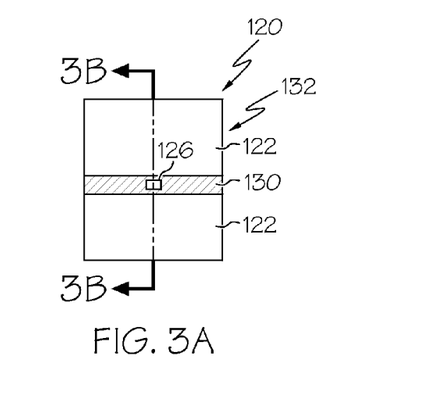
FIGS. 3A and 3B schematically depict a wavelength conversion device for use in conjunction with one or more embodiments of the frequency converted light sources shown and described herein.
Figure 3B:
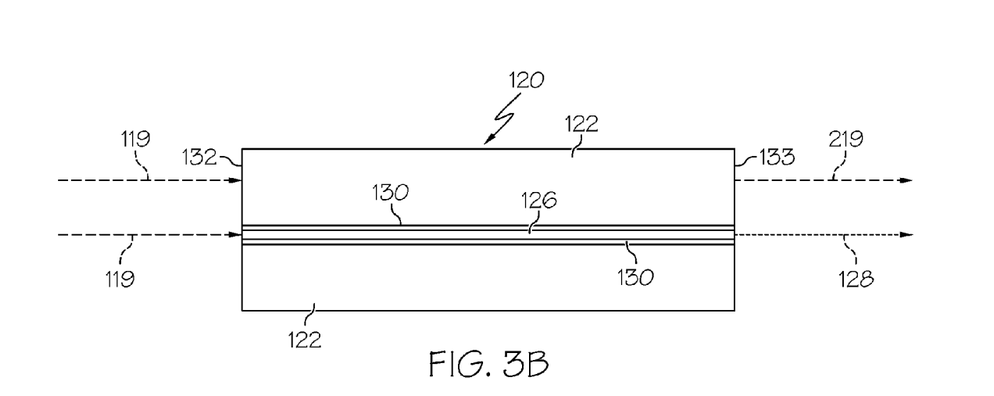

Referring now to FIGS. 3A-3B, an input facet 132 (FIG. 3A) and cross section (FIG. 3B) of one embodiment of a wavelength conversion device 120 is schematically depicted. The wavelength conversion device 120 comprises a bulk crystal material 122, such as lithium niobate, with an embedded waveguide portion 126 formed from, for example, MgO-doped lithium niobate. The waveguide portion 126 extends between an input facet 132 and an output facet 133. When the wavelength conversion device 120 is a PPLN crystal, the waveguide portion 126 of the PPLN crystal may have dimensions (e.g., height and width) on the order of 5 microns. In the embodiment of the wavelength conversion device 120 shown in FIGS. 3A and 3B, the wavelength conversion device 120 comprises a waveguide portion 126 which is embedded in a low refractive index layer 130 disposed between two slabs of bulk crystal material 122A, 122B. Referring to FIG. 3A, each slab of bulk crystal material 122A, 122B may be substantially rectangular or square in cross section. Typical cross sectional dimensions of the input facet 132 are on the order of 500-1500 microns.

Referring to FIG. 3B, when an output beam having a first wavelength $\lambda_1$ is directed into the waveguide portion 126 of the wavelength conversion device 120, such as the output beam 119 of the semiconductor laser 110, the output beam may be propagated through the waveguide portion 126 of the wavelength conversion device 120 where at least a portion of the output beam is converted to a second wavelength $\lambda_2$. The wavelength conversion device 120 emits a wavelength converted output beam 128 from the output facet 133. The wavelength converted output beam 128 may comprise converted wavelength light (e.g., light having a second wavelength $\lambda_2$) as well as unconverted light (e.g., light having the first wavelength $\lambda_1$). For example, in one embodiment, the output beam 119 produced by the semiconductor laser 110 and directed into the waveguide portion 126 of the wavelength conversion device 120 has a wavelength of about 1060 nm (e.g., output beam 119 is an infrared light beam). In this embodiment, the wavelength conversion device 120 converts at least a portion of the infrared light beam to visible light such that the waveguide portion 126 of the wavelength conversion device emits a wavelength converted output beam 128 a wavelength of about 530 nm (e.g., visible green light) in addition to light having a wavelength of about 1060 nm.

In another embodiment, when an output beam having a first wavelength $\lambda_1$ is directed onto the input facet 132 of the wavelength conversion device, but not into the waveguide portion 126 of the wavelength conversion device 120 (e.g., the output beam is incident on the bulk crystal material 122 of the wavelength conversion device 120), the output beam is guided through the bulk crystal material 122 of the wavelength conversion device 120 and emitted from the output facet 133 without being converted to a second wavelength $\lambda_2$ due to the phenomenon of total internal reflection. For example, when the output beam 119 incident on the non-waveguide portion or bulk crystal material 122 of the wavelength conversion device 120 has a first wavelength $\lambda_1$ of 1060 nm (e.g., the output beam 119 is an infrared beam), the wavelength converted output beam 128 emitted from the output facet 133 of the wavelength conversion device will also have a wavelength of 1060 nm since little or no wavelength conversion occurs in the bulk crystal material 122.

Referring now to FIG. 1, one embodiment of a frequency converted light source 100 is depicted in which the semiconductor laser 110, the wavelength conversion device 120 and the adaptive optics 140 are oriented in a folded configuration. More specifically, the output of the semiconductor laser 110 and the input of the wavelength conversion device 120 are positioned on different optical axes. The output beam 119 emitted by the semiconductor laser 110 is coupled into the waveguide portion of the wavelength conversion device 120 with adaptive optics 140. Specifically, the output beam 119 is redirected from its initial pathway in order to order to facilitate coupling the output beam 119 into the waveguide portion of the wavelength conversion device 120. Accordingly, in this embodiment, the adaptive optics 140 may comprise an adjustable optical component 144, specifically an adjustable mirror, and a lens 142.

The lens 142 of the adaptive optics 140 may collimate and focus the output beam 119 emitted by the semiconductor laser 110 into the waveguide portion 126 of the wavelength conversion device 120.

The adjustable optical component 144 may be rotated about a first scanning axis substantially parallel to the x-axis depicted in FIG. 1 and about a second scanning axis substantially parallel to the y-axis to introduce angular deviation in the output beam 119. The adjustable optical component 144 may comprise a mirror portion and an actuator portion and the adjustable optical component 144 may be rotated about either scanning axis by adjusting the actuator portion of the adjustable optical component.

For example, in one embodiment, the adjustable optical component 144 may comprise one or more movable micro-opto-electromechanical systems (MOEMS) or micro-electro-mechanical system (MEMS) operatively coupled to a mirror. The MEMS or MOEMS devices may be configured and arranged to vary the position of the output beam 119 on the input facet of the wavelength conversion device 120. Use of MEMS or MOEMS devices enables adjustment of the output beam 119 to be done extremely rapidly over large ranges. For example, a MEMS mirror with a +/−1 degree mechanical deflection, when used in conjunction with a 3 mm focal length lens, may allow the output beam to be angularly displaced +/−100 μm on the input face of the wavelength conversion device 120. The adjustment of the output beam may be done at frequencies on the order of 100 Hz to 20 kHz due to the fast response time of the MEMS or MOEMS device.

In the frequency converted light source 100 illustrated in FIG. 1, the adjustable optical component 144 is a micro-opto-electromechanical mirror incorporated in a relatively compact, folded-path optical system. In the illustrated configuration, the adjustable optical component 144 is configured to fold the optical path such that the optical path initially passes through the lens 142 to reach the adjustable optical component 144 as a collimated or nearly collimated beam and subsequently returns through the same lens 142 to be focused on the wavelength conversion device 120. This type of optical configuration is particularly applicable to wavelength converted laser sources where the cross-sectional size of the output beam generated by the semiconductor laser 110 is close to the size of the waveguide on the input face of the wavelength conversion device 120, in which case a magnification close to one would yield optimum coupling in focusing the output beam on the input face of the wavelength conversion device 120. For the purposes of defining and describing this embodiment of the frequency converted light source 100, it is noted that reference herein to a "collimated or nearly collimated" beam is intended to cover any beam configuration where the degree of beam divergence or convergence is reduced, directing the beam towards a more collimated state.

Still referring to FIG. 1, the frequency converted light source 100 may also comprise a filtering window 179 positioned proximate the output of the wavelength conversion device 120. The filtering window prevents non-wavelength converted light (i.e., IR light in the embodiments shown and described herein) from being emitted from the frequency converted light source 100. Accordingly, it will be understood that, once the wavelength converted output beam 128 exits the frequency converted light source 100, the wavelength converted output beam 128 only contains wavelength converted light.

The frequency converted light source 100 may also comprise a package controller 150. The package controller 150 may comprise one or more micro-controllers or programmable logic controllers used to store and execute programmed instructions for operating the frequency converted light source 100. Alternatively, the micro-controllers or programmable logic controllers may directly execute an instruction set. The package controller 150 may be electrically coupled to the semiconductor laser 110, the adaptive optics 140 and an optical detector 170 (described further herein) and programmed to operate both the semiconductor laser 110 and the adaptive optics 140. More specifically, in one embodiment, the package controller 150 may comprise drivers 152, 154 for controlling the adaptive optics and the wavelength selective section of the semiconductor laser, respectively.

The adaptive optics driver 152 may be coupled to the adaptive optics 140 with leads 156, 158 and supplies the adaptive optics 140 with x- and y-position control signals through the leads 156, 158, respectively. The x- and y-position control signals facilitate positioning the adjustable optical component of the adaptive optics in the x- and y-directions which, in turn, facilitates positioning the output beam 119 of the semiconductor laser 110 on the input facet of the wavelength conversion device 120. For example, when the adjustable optical component 144 of the adaptive optics 140 is an adjustable mirror, as shown in FIG. 1, the x- and y-position control signals may be used to rotate the adjustable mirror about the first scanning axis and the second scanning axis such that the output beam 119 of the semiconductor laser 110 is scanned over the input facet of the wavelength conversion device 120.

The wavelength selective section driver 154 may be coupled to the semiconductor laser 110 with lead 155. The wavelength selective section driver 154 may supply the wavelength selective section 112 of the semiconductor laser 110 with wavelength control signal(s) which facilitates adjusting the wavelength $\lambda_1$ of the output beam 119 emitted from the output facet of the semiconductor laser 110.

The frequency converted light source 100 shown in FIG. 1 may be coupled to a data source 160, such as a programmable logic controller, which supplies the frequency converted light source 100 with an encoded data signal which may be representative of a video image, still image or the like. More specifically, the data source 160 may be coupled to the gain section of the semiconductor laser 110 via lead 162. The data source 160 may control the lasing intensity of the semiconductor laser 110 such that the output of the frequency converted light source 100 forms an image when projected. To control the lasing intensity of the semiconductor laser 110, the encoded data signal injects a gain current I into the gain section of the semiconductor laser 110. Typically, the periodic frequency $F_{DATA}$ of the gain current I is representative of the video image or still image of the encoded data signal such that, when the output of the frequency converted light source is projected, as modulated by the periodic frequency $F_{DATA}$ of the gain current I, the projected image is the video image or still image of the encoded data signal. Typically, the periodic frequency $F_{DATA}$ of the encoded data signal is about 60 Hz which generally corresponds to the video frame rate of a projected image.

In order to measure the output intensity of the wavelength converted output beam 128 emitted from the frequency converted light source 100, a beam splitter 180 may be positioned proximate the output of the wavelength conversion device 120. The beam splitter 180 is used to redirect a portion of the wavelength converted output beam 128 emitted from the wavelength conversion device 120 into an optical detector 170 which is used to measure the intensity of the emitted visible wavelength converted output beam 128 and output an electrical signal proportional to the measured intensity. In the embodiments shown herein, the optical detector 170 may be coupled to the package controller with lead 172 such that the electrical signal proportional to the measured intensity of the wavelength converted output beam is provided to the controller.

Startup methods for aligning the frequency converted light source 100 will now be discussed with specific reference to the frequency converted light source 100 shown in FIG. 1 and FIGS. 4A and 4B.

Figure 4A:
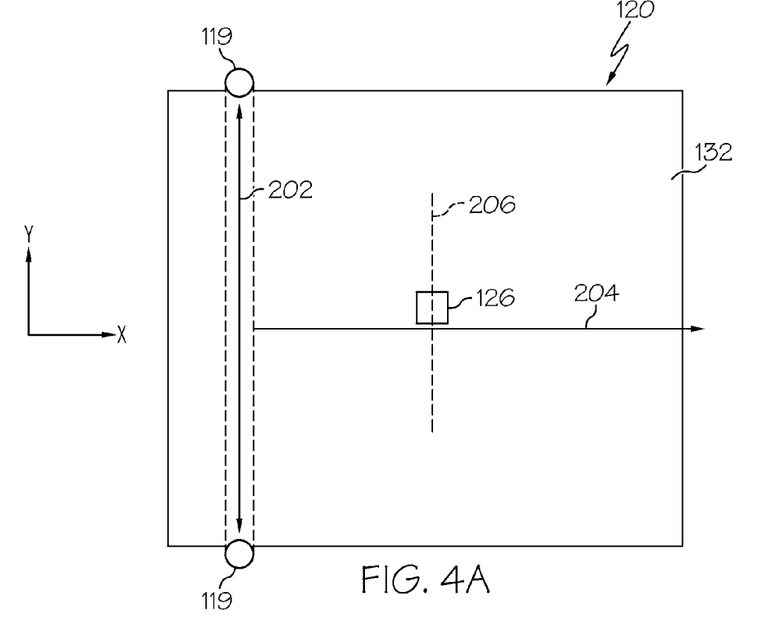
FIGS. 4A and 4B schematically depict one embodiment of a start-up method for a frequency converted light source according to one or more embodiments shown and described herein.
Figure 4B:
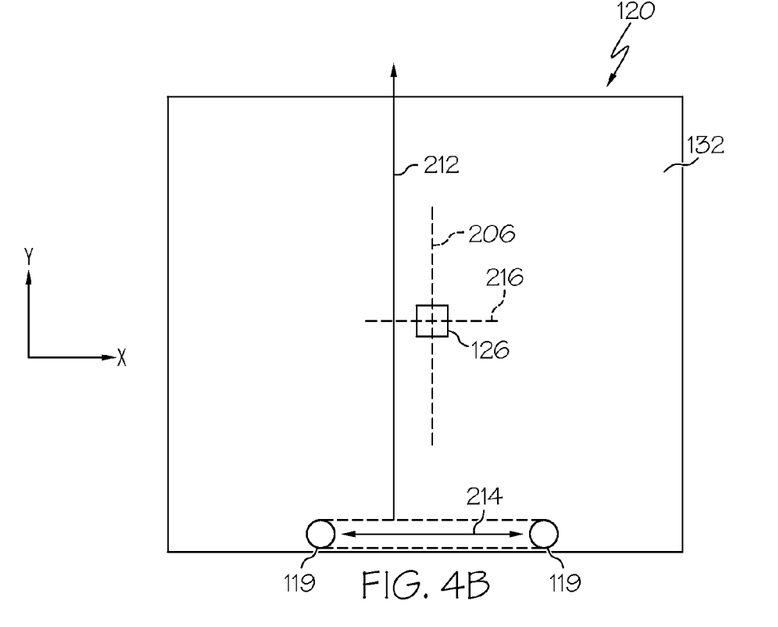

Referring now to FIGS. 1 and 4A-4B, FIGS. 4A and 4B schematically depict a start up method for a frequency converted light source 100. In an initial step, the semiconductor laser 110 of the frequency converted light source 100 is powered on and a output beam 119 of the semiconductor laser 110 is directed on to the input facet 132 of the wavelength conversion device 120 with the adaptive optics 140, as described above. In one embodiment, a constant gain current $I_G$ is initially supplied to the semiconductor laser 110 to control the lasing intensity of the output beam 119. However, it should be understood that the gain current $I_G$ may be, in the alternative, be modulated, such as when the frequency of the gain current I is indicative of an encoded data signal (i.e., an image).

With the output beam 119 of the semiconductor laser 110 directed on to the input facet 132, a modulated wavelength control signal is supplied to the wavelength control section of the semiconductor laser to modulate the wavelength of the output beam 119 over a wavelength alignment range. In one embodiment, the wavelength alignment range generally corresponds to at least a portion of the phase-matching bandwidth of the waveguide portion 126 of the wavelength conversion device 120. For example, in one embodiment, the phase matching bandwidth of the waveguide portion 126 has a full-width-half-max (FWHM) of 0.24 nm. In this embodiment, the wavelength of the output beam 119 of the semiconductor laser 110 may be varied over a wavelength alignment range which is 0.24 nm or more. In at least one embodiment of a start-up method described herein, the wavelength of the semiconductor laser 110 is varied continuously throughout the start-up method until first and second alignment set points are determined for the output beam 119 on the input facet of the wavelength conversion device 120. In the embodiments described herein, the wavelength of the output beam is modulated at a wavelength modulation frequency $F_{mod}$. In one embodiment, the wavelength modulation frequency may be from about 1 kHz to about 20 kHz. In another embodiment, the wavelength modulation frequency may be from about 1 kHz to about 10 kHz. In yet another embodiment, the wavelength modulation frequency may be from about 5 kHz to about 10 kHz.

As will be described in more detail herein, the adjustable optical component 144 may be oscillated about a first scanning axis at a first oscillation frequency and about a second scanning axis at a second oscillation frequency. In general, the wavelength modulation frequency $F_{mod}$ is greater than either the first oscillation frequency $F_1$ or the second oscillation frequency $F_2$. In one particular embodiment, the modulation frequency $F_{mod}$ is greater than 5 times the greater of $F_1$ and $F_2$. For example, in one embodiment, the first oscillation frequency $F_1$ and the second oscillation frequency $F_2$ are on the order of about 400 Hz while the wavelength modulation frequency $F_{mod}$ is on the order of about 2 kHz. In another embodiment, the first oscillation frequency $F_1$ and the second oscillation frequency $F_2$ are on the order of about 1 kHz while the wavelength modulation frequency $F_{mod}$ is on the order of about 5 kHz.

Referring to FIG. 4A, as the wavelength of the output beam 119 is modulated, a control signal is supplied to the adjustable optical component 144 to maximize the displacement of the adjustable optical component 144 about one axis in one direction (i.e., either clockwise or counter clockwise). For example, when the adjustable optical component is a MEMS mirror, as described herein, a y-position control signal may be supplied to the MEMS mirror which, in turn, rotates the adjustable optical component to its maximum displacement about a second scanning axis which, in the embodiment shown in FIG. 4A, is parallel to the y-axis. In one embodiment, when the adjustable optical component 144 is at its maximum displacement, the output beam 119 of the semiconductor laser 110 is positioned at or near an edge or the input facet 132 of the wavelength conversion device 120.

With the adjustable optical component at its maximum displacement in one direction, a modulated x-position control signal is supplied to the adjustable optical component 144 with the adaptive optics driver 152 of the package controller 150 causing the adjustable optical component 144 to oscillate about the first scanning axis which, in the embodiment shown in FIGS. 1 and 4A, is parallel to the x-axis. The adjustable optical component is oscillated about the first scanning axis at a first oscillation frequency $F_1$, as described above. In the embodiments described herein, the x-position control signal may be a ramp function, a triangle function, a sinusoidal function or any other waveform or function suitable for oscillating the adjustable optical component 144 about the first scanning axis. In one particular embodiment, the first oscillation frequency $F_1$ is equal to $(N+\frac{1}{4})*F_0$, where $2 \leq N \leq 10$ and $F_0$ is a video frame rate of a projection system in which the frequency converted light source is used. In general, the x-position control signal causes the adjustable optical component 144 to oscillate over a first angular range which, in one embodiment, corresponds to the maximum range of angular displacement of the adjustable optical component about the first scanning axis.

Oscillating the adjustable optical component 144 about the first scanning axis causes the output beam 119 to traverse or dither over the input facet 132 on a first dithering trace 202, which, in the embodiment shown, is generally parallel with the y-axis. As the adjustable optical component is oscillated about the first scanning axis, the angular orientation of the adjustable optical component is adjusted about the second scanning axis such that the position of the first dithering trace 202 is varied over the input facet 132 of the wavelength conversion device 120 on a first scan line 204. In the embodiments described herein, the position of the first dithering trace is varied by a first amount which is less than ten times a dimension of the waveguide portion of the wavelength conversion device in a direction of the first scan line. For example, in one embodiment, the first amount is on the order of about 10 microns.

As the position of the first dithering trace 202 is varied over the input facet 132 on the first scan line 204, the intensity of the wavelength converted output beam 128 is monitored with the optical detector 170. As noted hereinabove, the filtering window 179 filters the output of the frequency converted light source 100 such that the only light which reaches the optical detector 170 is wavelength converted light. Accordingly, the optical detector 170 only produces an output signal when the output beam 119 is positioned on the waveguide portion 126 of the wavelength conversion device 120.

Figure 6A:
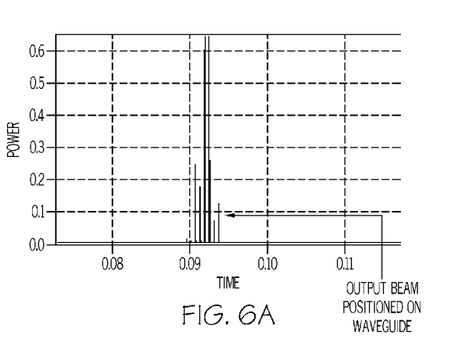
FIGS. 6A and 6B graphically depict the output intensity of a wavelength converted output beam as a function of time according to one embodiment of a start-up method for a frequency converted light source shown and described herein.

Referring now to FIG. 6A, a plot of time vs. output intensity (i.e., power) of the wavelength converted output beam 128 is graphically depicted as the first dithering trace is scanned over the waveguide portion 126 of the wavelength conversion device on the first scan line 204. In the embodiments described herein, the output intensity of the wavelength converted output beam 128 fluctuates as the position of the first dithering trace 202 is varied. This is because the position of the output beam 119 on the waveguide portion 126 of the wavelength conversion device does not always coincide with the wavelength of the output beam 119 which yields a wavelength converted output beam 128 (i.e., both position and wavelength are simultaneously fluctuating). This leads to the "spiky" or "pulsing" character of the time dependent signal as shown in FIG. 6A. In either case, the presence of an intermittent increase in intensity is indicative of the output beam 119 being positioned on the waveguide at a particular location along the first scan line 204. Accordingly it should be understood that the period of oscillation of the adjustable optical component about the first scanning axis and the modulation period of the wavelength of the semiconductor laser should be significantly faster than the period between consecutive steps of the first dithering trace 202 on the first scan line 204 to insure that, if the output beam 119 is positioned on the waveguide portion 126 during the scan, the output intensity of the wavelength converted output beam 128 will be observed with the optical detector 170.

In the embodiments described herein, the output signal from the optical detector may be rapidly sampled such that spikes in the output intensity of the wavelength converted output beam 128 are resolved, and the value of the highest spikes are recorded by the package controller 150. Alternatively, the output signal from the optical detector may be integrated or averaged and the integrated or averaged value recorded by the package controller 150 over a measurement time period which is greater than an oscillation period of the adjustable optical component about a scanning axis. In embodiments where the output signal of the optical detector 170 is rapidly sampled, the sampling frequency is selected to prevent aliasing (i.e. the sampling frequency is much greater than the oscillation frequencies of either the adjustable optical component or the wavelength of the semiconductor laser). In embodiments where the first oscillation frequency $F_1$ is equal to $(N+\frac{1}{4})*F_0$, the output signal of the optical detector may be filtered at a frequency $2*F_1$ and a maximum value of the filtered output signal is utilized to determine the first alignment set point. Such a technique may be utilized in embodiments where the wavelength converted output beam 128 is combined with the output beams of other light sources to form an image, such as in a projector system.

The package controller 150 processes the output signal of the optical detector 170 and, based on the output signal, determines the location along the first scan line 204 where the output beam 119 is aligned with the waveguide portion 126 of the wavelength conversion device 120 and stores this location (and the corresponding angular orientation of the adjustable optical component 144 about the first scanning axis) as the first alignment set point 206. Accordingly, it should be understood that the first alignment set point generally corresponds to the position of the output beam 119 on the input facet of the wavelength conversion device 120 where the output intensity of the wavelength converted output beam 128 is maximized.

In the embodiments described herein, stepping the first dithering trace 202 over a first scan line 204 as the output beam 119 traverses over the first dithering trace 202 effectively produces a one-dimensional scan of the output beam 119 over the input facet 132 of the wavelength conversion device 120. This one-dimensional scan can be performed very rapidly. For example, in one embodiment, only 1 msec of data acquisition time is necessary for each position of the first dithering trace 202 on the first scan line 204. If the first scan line has a length of +/−50 microns and the first dithering trace 202 is positioned in 1 micron increments, then only 100 msec of time is needed to complete the one dimensional scan.

Referring now to FIGS. 1 and 4B, after the first alignment set point is determined with the package controller 150, the oscillation of the adjustable optical component about the first scanning axis is terminated. Thereafter, the semiconductor laser 110 and the adjustable optical component 144 are operated to determine a second alignment set point of the output beam 119 on the waveguide portion 126 of the wavelength conversion device 120 in a manner similar to that used to the determine the first alignment set point along the first scan line. For example, the wavelength of the wavelength converted output beam 128 is modulated as described above. Thereafter, a control signal is supplied to the adjustable optical component 144 to maximize the displacement of the adjustable optical component 144 about a first scanning axis. For example, when the adjustable optical component is a MEMS mirror, as described herein, an x-position control signal may be supplied to the MEMS mirror which, in turn, rotates the adjustable optical component to its maximum displacement about a first scanning axis which, in the embodiment shown in FIGS. 1 and 4A-4B, is parallel to the x-axis. In one embodiment, when the adjustable optical component 144 is at its maximum displacement, the output beam 119 of the semiconductor laser 110 is positioned at or near an edge of the input facet 132 of the wavelength conversion device 120.

With the adjustable optical component at its maximum displacement in one direction, a modulated y-position control signal is supplied to the adjustable optical component 144 with the adaptive optics driver 152 of the package controller 150 causing the adjustable optical component 144 to oscillate about the second scanning axis which, in the embodiment shown in FIGS. 1 and 4A-4B, is parallel to the y-axis. The adjustable optical component is oscillated about the second scanning axis at a second oscillation frequency $F_2$. In at least one embodiment described herein, the wavelength modulation frequency $F_{mod}$ is greater than the second oscillation frequency $F_2$. In another embodiment, the second oscillation frequency $F_2$ is equal to the first oscillation frequency $F_1$. In the embodiments described herein, the y-position control signal may be a ramp function, a triangle function, a sinusoidal function or any other waveform or function suitable for oscillating the adjustable optical component 144 about the second scanning axis. In one particular embodiment, the first oscillation frequency $F_2$ is equal to $(N+\frac{1}{4})*F_0$, where $2 \leq N \leq 10$ and $F_0$ is a video frame rate of a projection system in which the frequency converted light source is used. The y-position control signal causes the adjustable optical component 144 to oscillate over a second angular range. In one embodiment, the second angular range is less than the first angular range. For example, in one embodiment, the second angular range may be less than 50% of the first angular range. In another embodiment, the second angular range may be less than 20% of the first angular range or even less than 10% of the first angular range. In another embodiment, the second angular range is less than the maximum range of angular displacement of the adjustable optical component about the second scanning axis. In another embodiment (not shown), the second angular range corresponds to the maximum range of angular displacement of the adjustable optical component about the second scanning axis.

Oscillating the adjustable optical component 144 about the second scanning axis causes the output beam 119 to traverse over the input facet 132 on a second dithering trace 214, which, in the embodiment shown, is generally parallel with the x-axis. In the embodiment shown in FIG. 4B, the second dithering trace 214 is parallel with the first scan line 204 (shown in FIG. 4A) and centered on the first alignment set point 206. In the embodiment shown in FIG. 4B, the second angular range is less than the maximum displacement of the adjustable optical component about the second scanning axis which, in turn, decreases the linear dimension over which the output beam 119 is traversed over the input facet 132 of the wavelength conversion device on the second dithering trace 214. In this embodiment, the linear dimension over which the output beam 119 is traversed over the input facet 132 on the second dithering trace 212 is less than the linear dimension over which the output beam 119 is traversed over the input facet 132 on the first dithering trace 202 thereby reducing the overall search time required and speeding up the alignment process.

As the adjustable optical component is oscillated about the second scanning axis, the angular orientation of the adjustable optical component is adjusted about the first scanning axis such that the position of the second dithering trace 214 is varied over the input facet 132 of the wavelength conversion device 120 on a second scan line 212. In the embodiments described herein, the position of the second dithering trace is varied by a second amount which is less than ten times a dimension of the waveguide portion of the wavelength conversion device in a direction of the second scan line. For example, in one embodiment, the second amount is on the order of about 10 microns. Stepping the second dithering trace 214 over a second scan line 212 as the output beam 119 traverses over the second dithering trace 214 produces a one-dimensional scan of the output beam 119 over the input facet of the wavelength conversion device 120. This one-dimensional scan can be performed very rapidly, as described above.

As the position of the second dithering trace 214 is varied over the input facet 132 on the second scan line 212, the intensity of the wavelength converted output beam 128 is monitored with the optical detector 170.

Figure 6B:
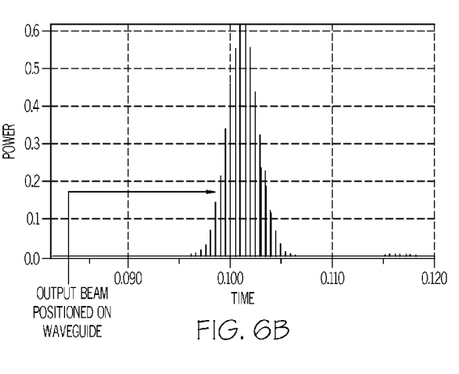

Referring now to FIG. 6B, a plot of time (x-axis) vs. output intensity (i.e., power) of the wavelength converted output beam 128 is graphically depicted as the second dithering trace is scanned over the waveguide portion 126 of the wavelength conversion device on the second scan line 212. As described above, the output intensity of the wavelength converted output beam 128 fluctuates as the position of the second dithering trace 214 is varied. As with the period of oscillation of the adjustable optical component about the first scanning axis and the modulation period of the wavelength of the semiconductor laser, the period of oscillation of the adjustable optical component should be significantly faster than the period between consecutive steps of the second dithering trace 214 on the second scan line 212 to insure that, if the output beam 119 is positioned on the waveguide portion 126 during the scan, the output intensity of the wavelength converted output beam 128 will be observed with the optical detector 170.

The package controller 150 processes the output signal of the optical detector 170 and, based on the output signal, determines the location along the second scan line 212 where the output beam 119 is aligned with the waveguide portion 126 of the wavelength conversion device 120 and stores this location (and the corresponding angular orientation of the adjustable optical component 144 about the second scanning axis) as the second alignment set point 216. Accordingly, it should be understood that the second alignment set point generally corresponds to a position of the output beam 119 on the input facet of the wavelength conversion device 120 where the output intensity of the wavelength converted output beam 128 is maximized. As noted hereinabove with respect to the first alignment set point, in one embodiment, the second alignment set point may be determined within 100 msec of initiating the search of the second alignment set point.

After the first alignment set point and the second alignment set point are determined by the package controller 150, oscillation of the wavelength of the output beam 119 is terminated. Thereafter, the first alignment set point and the second alignment set point are utilized to position the output beam 119 on the waveguide portion 126 of the wavelength conversion device 120.

In one embodiment, after the output beam 119 is positioned on the waveguide portion 126 of the wavelength conversion device 120 with the first alignment set point and the second alignment set point, the wavelength of the output beam 119 is varied over the wavelength alignment range as the output intensity of the wavelength converted output beam 128 is monitored with the optical detector 170, as described above. In this embodiment, the package controller 150 determines an alignment wavelength at which the intensity of the wavelength converted output beam 128 is a maximum and, thereafter, operates the semiconductor laser such that the wavelength of the output beam 119 is the alignment wavelength. Because the wavelength of the semiconductor laser can be rapidly tuned over the wavelength alignment range (i.e., faster than 1 msec per step), and the output signal of the optical detector can be quickly sampled, the alignment wavelength can be rapidly determined. For example, covering a 2 nm wavelength alignment range with 0.05 nm steps yields (40 steps*1 msec)=40 msec of sweep time to determine the alignment wavelength.

After the output beam 119 is positioned on the waveguide portion 126 of the wavelength conversion device 120 with the first alignment set point and the second alignment set point, closed-loop feedback control of the frequency converted light source 100 is initiated. For example, in one embodiment, the closed-loop control utilizes a 3-dimensional control loop (i.e., 2 spatial dimensions and a wavelength dimension) to maintain the alignment of the semiconductor laser with the wavelength conversion device.

Figure 7:
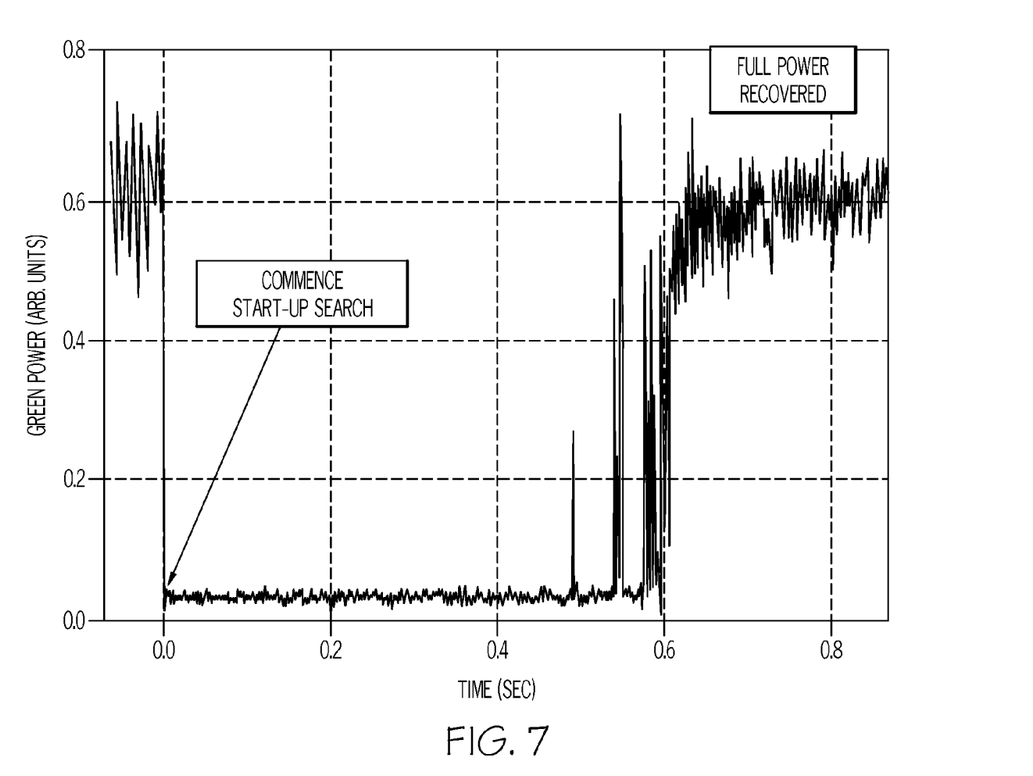
FIG. 7 graphically depicts the output intensity of a wavelength converted output beam as a function of time according to one embodiment of a start-up method for a frequency converted light source shown and described herein.

Referring to FIG. 7, which depicts a plot of time (x-axis) vs. the output power of the frequency converted light source (y-axis), it should be understood that, in at least one embodiment, the time elapsed from the initiation of the start-up method to initiation of closed loop control may be less than 2 seconds or even less than 1 second. In another embodiment, the elapsed time may be less than 650 msec or even less than 250 msec. Accordingly, it will be understood that the alignment method described herein can achieve alignment of the semiconductor laser with the wavelength conversion device more rapidly than prior art raster scanning techniques which may take as long as 100 seconds or longer.

In the embodiments described herein, the wavelength of the semiconductor laser is modulated throughout the start-up routine at least until both the first alignment set point and the second alignment set point have been determined. However, it should be understood that, in other embodiments, the wavelength of the semiconductor laser may be maintained at a constant value during the start-up routine.

In embodiments where 3D control space (i.e., x, y and wavelength) are searched, the method described herein reduces the overall search time and the number of search points needed to obtain alignment between the semiconductor laser and the wavelength conversion device. For example, when the frequency converted light source is utilized in a projector sample, the projector sample may only sample the output power of the frequency converted light source at the frame rate of the projector. Since a typical frame rate for a projector is 1/60 Hz (~17 msec), only 60 independent samples of the frequency converted light source are taken every second. If a conventional raster search of the input facet of the wavelength conversion device is performed in 3D space, approximately 20×50×50=40,000 points are searched. At this search resolution and 17 msec sampling, the raster scan would take 667 seconds. To reduce the time one is forced to either reduce the volume of space, searched or reduce the resolution at which the search is performed. Both of these modifications raise the risk that the alignment location may be completely missed during the search. However with the start-up methods described herein, only 50+50+20=120 points are needed to determine the first alignment set point, the second alignment set point, and the alignment wavelength. At a search resolution or sampling rate of 17 msec, the start up method described herein takes 2 seconds or less with no reduction in search volume or search resolution. Although not all systems may be restricted to sampling the frequency converted light source at once per video frame, the benefits of the methods described herein (i.e., decreased search time and reduced sampling rates, etc.) may be taken advantage of in other systems regardless of the sampling rate.

Figure 5:
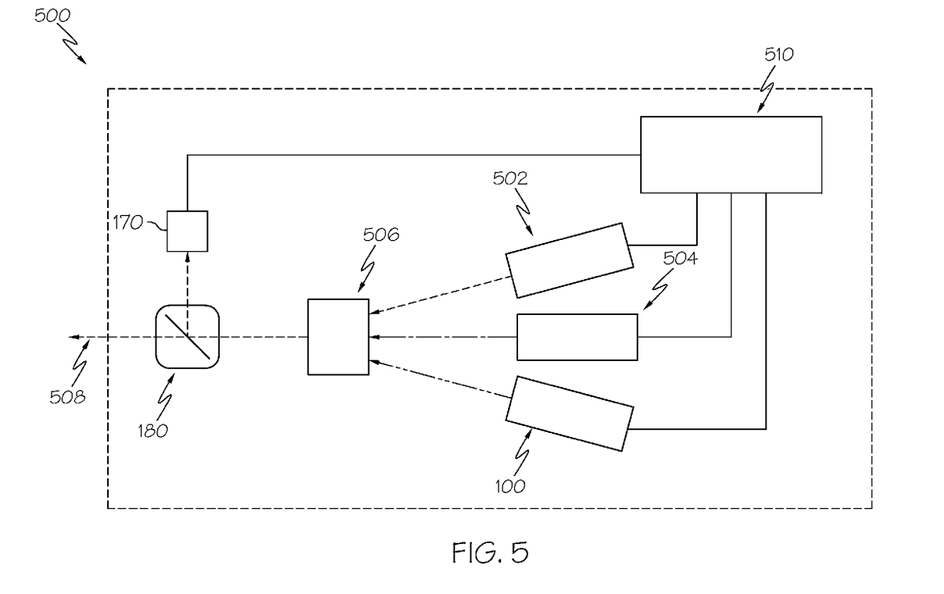
FIG. 5 schematically depicts a laser projector system for use in conjunction with one or more of the start-up methods described herein.

Referring to FIG. 5, the start-up method may be utilized in a projection system 500 comprising a first light source 502, a second light source 504, and a frequency converted light source 100. The frequency converted light source 100 may comprise a semiconductor laser 110 optically coupled to a wavelength conversion device 120 as described herein. The output beams of the first light source 502, the second light source 504 and the frequency converted light source 100 may be combined with optical components 506 to project a composite output beam 508. Each of the first light source 502, the second light source 504 and the frequency converted light source 100 may be coupled to a system controller 510 which is utilized to control the lasing intensity of each light source and thereby project a color image with the light sources.

In one embodiment, the start-up methods described herein may be utilized in conjunction with the projection system 500. In this embodiment, the first light source 502 is supplied with a first gain current $I_1$ at a first modulated gain frequency $F_{f1}$ and the second light source 504 is supplied with a second gain current $I_2$ at a second modulated frequency $F_{f2}$. The frequency converted light source 100 is supplied with a constant gain current $I_c$. A combined output intensity of the first light source 502, the second light source 504 and the frequency converted light source 100 is monitored with an optical detector 170 at a frame rate $F_0$ of the projection system by the system controller 510.

As described herein above with respect to FIGS. 1 and 4A-4B, the frequency converted light source 100 may be operated such that the output beam of the semiconductor laser is directed onto an input facet of the wavelength conversion device with the adjustable optical component and a wavelength of the output beam of the semiconductor laser is modulated over a wavelength alignment range corresponding to at least a portion of the phase-matching bandwidth of a waveguide portion of the wavelength conversion device. The adjustable optical component is oscillated over a first angular range about a first scanning axis such that the output beam of the semiconductor laser is dithered over the input facet of the wavelength conversion device on a first dithering trace. In this embodiment, the adjustable optical component is oscillated about the first scanning axis at a first oscillation frequency $F_1=(N+\frac{1}{4})*F_0$, where $2 \leq N \leq 10$. The angular orientation of the adjustable optical component is adjusted about a second scanning axis to vary a position of the first dithering trace over the input facet of the wavelength conversion device on a first scan line. A first alignment set point on the first scan line is determined by filtering the combined output intensity at a frequency of $2*F_1$ with a zero-phase delay filter to isolate a portion of the combined output intensity attributable to an output intensity of a wavelength converted output beam emitted from the wavelength conversion device as the position of the first dithering trace is varied over the first scan line.

Thereafter, the adjustable optical component is oscillated over a second angular range about a second scanning axis such that the output beam of the semiconductor laser is dithered over the input facet of the wavelength conversion device on a second dithering trace centered on the first alignment set point. The second angular range is less than the first angular range, and the adjustable optical component is oscillated about the second scanning axis at a second oscillation frequency $F_2=F_1$. The angular orientation of the adjustable optical component is adjusted about the first scanning axis to vary a position of the second dithering trace over the input facet of the wavelength conversion device on a second scan line.

A second alignment set point on the second scan line is determined by filtering the combined output intensity at a frequency $2*F_1$ with a zero-phase delay filter to isolate a portion of the combined output intensity attributable to an output intensity of the wavelength converted output beam emitted from the wavelength conversion device as the position of the second dithering trace is varied over the second scan line. The first alignment set point and the second alignment set point define a position where the output beam of the wavelength conversion device is aligned with the waveguide portion of the wavelength conversion device. The modulation of the wavelength of the output beam of the semiconductor laser and the output beam of the semiconductor laser is positioned on the waveguide portion of the wavelength conversion device using the first alignment set point and the second alignment set point.

In an alternative embodiment, each of the first light source 502, the second light source 504 and the wavelength converted light source 100 may be supplied with a modulated gain current, such as when the projector system is being used to project an image during the start-up routine. In this embodiment, the system controller 510 may monitor the gain current supplied to the frequency converted light source 100 and, when the gain current falls below a predetermined threshold level, the position of the first dithering trace or the position of the second dithering trace is held constant on the input facet of the wavelength conversion device until the gain current for the frequency converted light source 100 returns to a level above the predetermined threshold level which, in turn, reduces the possibility that the output beam will traverse the waveguide portion of the wavelength conversion device when the intensity of the wavelength converted output beam is low or zero.

For the purposes of defining and describing the present invention, it is noted that reference herein to values that are "on the order of" a specified magnitude should be taken to encompass any value that does not vary from the specified magnitude by one or more orders of magnitude. It is also noted that one or more of the following claims recites a controller "programmed to" execute one or more recited acts. For the purposes of defining the present invention, it is noted that this phrase is introduced in the claims as an open-ended transitional phrase and should be interpreted in like manner as the more commonly used open-ended preamble term "comprising." In addition, it is noted that recitations herein of a component of the present invention, such as a controller being "programmed" to embody a particular property, function in a particular manner, etc., are structural recitations, as opposed to recitations of intended use. More specifically, the references herein to the manner in which a component is "programmed" denotes an existing physical condition of the component and, as such, is to be taken as a definite recitation of the structural characteristics of the component.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A start-up method for a frequency converted light source comprising a semiconductor laser, a wavelength conversion device, and an adjustable optical component arranged to optically couple an output beam of the semiconductor laser with an input facet of the wavelength conversion device, the start-up method comprising:
    directing the output beam of the semiconductor laser onto the input facet of the wavelength conversion device with the adjustable optical component;
    modulating a wavelength of the output beam of the semiconductor laser over a wavelength alignment range corresponding to at least a portion of a phase-matching bandwidth of a waveguide portion of the wavelength conversion device;
    monitoring an output intensity of a wavelength converted output beam emitted from the wavelength conversion device;
    oscillating the adjustable optical component over a first angular range about a first scanning axis such that the output beam of the semiconductor laser is dithered over the input facet of the wavelength conversion device on a first dithering trace;
    adjusting an angular orientation of the adjustable optical component about a second scanning axis to vary a position of the first dithering trace over the input facet of the wavelength conversion device on a first scan line as the wavelength of the output beam is modulated and the adjustable optical component is oscillated about the first scanning axis;
    determining a first alignment set point on the first scan line based on the output intensity of the wavelength converted output beam as the position of the first dithering trace is varied over the first scan line;
    oscillating the adjustable optical component over a second angular range about the second scanning axis such that the output beam of the semiconductor laser is dithered over the input facet of the wavelength conversion device on a second dithering trace;
    adjusting the angular orientation of the adjustable optical component about the first scanning axis to vary a position of the second dithering trace over the input facet of the wavelength conversion device on a second scan line as the wavelength of the output beam is modulated and the adjustable optical component is oscillated about the second scanning axis;
    determining a second alignment set point on the second scan line based on the output intensity of the wavelength converted output beam as the position of the second dithering trace is varied over the second scan line, wherein the first alignment set point and the second alignment set point define a position where the output beam of the wavelength conversion device is aligned with the waveguide portion of the wavelength conversion device;
    terminating modulating the wavelength of the output beam of the semiconductor laser; and
    positioning the output beam of the semiconductor laser on the waveguide portion of the wavelength conversion device using the first alignment set point and the second alignment set point.

2. The start-up method of claim 1, further comprising:
    varying the wavelength of the output beam of the semiconductor laser over the wavelength alignment range after the output beam of the semiconductor laser is positioned on the waveguide portion of the wavelength conversion device using the first alignment set point and the second alignment set point; and
    determining an alignment wavelength of the output beam based on the output intensity of the wavelength converted output beam as the wavelength of the output beam is varied over the wavelength alignment range; and
    operating the semiconductor laser such that the wavelength of the output beam is the alignment wavelength.

3. The start-up method of claim 1, wherein the wavelength alignment range is 0.24 nm or greater.

4. The start-up method of claim 1, wherein and the second angular range is less than the first angular range.

5. The start-up method of claim 1, further comprising initiating closed-loop feedback control of the frequency converted light source after the output beam of the semiconductor laser is positioned on the waveguide portion of the wavelength conversion device using the first alignment set point and the second alignment set point.

6. The start-up method of claim 1, wherein the position of the first dithering trace is varied by a first amount which is less than ten times a dimension of the waveguide portion of the wavelength conversion device in a direction of the first scan line.

7. The start-up method of claim 6, wherein the first amount is about 10 micron.

8. The start-up method of claim 1, wherein the second dithering trace is centered on the first alignment set point and the position of the second dithering trace is varied by a second amount which is less than ten times a dimension of the waveguide portion of the wavelength conversion device in a direction of the second scan line.

9. The start-up method of claim 8, wherein the second amount is about 10 microns.

10. The start-up method of claim 1, wherein the second angular range is less than 50% of the first angular range.

11. The start-up method of claim 1, wherein the first angular range corresponds to a maximum range of angular displacement of the adjustable optical component about the first scanning axis.

12. The start-up method of claim 1, wherein:
    the wavelength of the output beam of the semiconductor laser is modulated at a wavelength modulation frequency $F_{mod}$;
    the adjustable optical component is oscillated about the first scanning axis at a first oscillation frequency $F_1$, wherein $F_{mod} > F_1$; and
    the adjustable optical component is oscillated about the second scanning axis at a second oscillation frequency $F_2$, wherein $F_{mod} > F_2$.

13. The start-up method of claim 12, wherein the wavelength modulation frequency $F_{mod}$ is greater than 5 times the greater of $F_1$ and $F_2$.

14. The start-up method of claim 12, wherein:
- the output intensity of the wavelength converted output beam is monitored with an optical detector which produces an output signal corresponding to the output intensity of the wavelength converted output beam;
- the first oscillation frequency $F_1$ is equal to $(N+\frac{1}{4})*F_0$, where $2 \leq N \leq 10$ and $F_0$ is a video frame rate of a projection system in which the frequency converted light source is used;
- the second oscillation frequency $F_2$ is equal to the first oscillation frequency $F_1$; and
- the first alignment set point and the second alignment set point are determined by filtering the output signal of the optical detector at a frequency of $2*F_1$ and determining a maximum value of the output intensity of a filtered output signal.

15. The start-up method of claim 1, wherein the output intensity of the wavelength converted output beam is measured by averaging the output intensity of the wavelength converted output beam over a measurement time period which is greater than an oscillation period of the adjustable optical component about the first scanning axis and greater than an oscillation period of the adjustable optical component about the second scanning axis.

16. A start-up method for a projection system comprising a first light source, a second light source and a frequency converted light source comprising a semiconductor laser, a wavelength conversion device, and an adjustable optical component arranged to optically couple an output beam of the semiconductor laser with an input facet of the wavelength conversion device, the start-up method comprising:
- supplying the first light source with a first gain current $I_1$ at a first modulated gain frequency $F_{f1}$;
- supplying the second light source with a second gain current $I_2$ at a second modulated frequency $F_{f2}$;
- supplying the frequency converted light source with a constant gain current IC;
- simultaneously monitoring a combined output intensity of the first light source, the second light source and the frequency converted light source at a frame rate $F_0$ of the projection system with a single optical detector;
- directing the output beam of the semiconductor laser onto the input facet of the wavelength conversion device with the adjustable optical component;
- modulating a wavelength of the output beam of the semiconductor laser over a wavelength alignment range corresponding to at least a portion of the phase-matching bandwidth of a waveguide portion of the wavelength conversion device;
- oscillating the adjustable optical component over a first angular range about a first scanning axis such that the output beam of the semiconductor laser is dithered over the input facet of the wavelength conversion device on a first dithering trace, wherein the adjustable optical component is oscillated about the first scanning axis at a first oscillation frequency $F_1=(N+\frac{1}{4})*F_0$, where $2 \leq N \leq 10$;
- adjusting an angular orientation of the adjustable optical component about a second scanning axis to vary a position of the first dithering trace over the input facet of the wavelength conversion device on a first scan line;
- determining a first alignment set point on the first scan line by filtering the combined output intensity to isolate a portion of a combined output intensity attributable to an output intensity of a wavelength converted output beam emitted from the wavelength conversion device as the position of the first dithering trace is varied over the first scan line;
- oscillating the adjustable optical component over a second angular range about the second scanning axis such that the output beam of the semiconductor laser is dithered over the input facet of the wavelength conversion device on a second dithering trace, wherein the second angular range is less than the first angular range and the adjustable optical component is oscillated about the second scanning axis at a second oscillation frequency $F_2=F_1$;
- adjusting the angular orientation of the adjustable optical component about the first scanning axis to vary a position of the second dithering trace over the input facet of the wavelength conversion device on a second scan line;
- determining a second alignment set point on the second scan line by filtering the combined output intensity to isolate a portion of the combined output intensity attributable to an output intensity of the wavelength converted output beam emitted from the wavelength conversion device as the position of the second dithering trace is varied over the second scan line, wherein the first alignment set point and the second alignment set point define a position where the output beam of the wavelength conversion device is aligned with the waveguide portion of the wavelength conversion device;
- terminating modulating the wavelength of the output beam of the semiconductor laser; and
- positioning the output beam of the semiconductor laser on the waveguide portion of the wavelength conversion device using the first alignment set point and the second alignment set point.

17. The method of claim 16, wherein the combined output intensity is filtered by filtering an output signal of the optical detector with a zero-phase delay filter at a frequency of $2*F_1$.

18. The start-up method of claim 16, wherein the first alignment set point is determined based on a maximum value of a filtered output signal as the position of the first dithering trace is varied over the input facet of the wavelength conversion device on the first scan line.

19. The start-up method of claim 18, wherein the second alignment set point is determined based on a maximum value of the filtered output signal as the position of the second dithering trace is varied over the input facet of the wavelength conversion device on the second scan line.

20. The start up method of claim 16, wherein the second dithering trace is centered on the first alignment set point and the position of the second dithering trace is varied by a second amount which is less than ten times a dimension of the waveguide portion of the wavelength conversion device in a direction of the second scan line.

* * * * *